United States Patent
Hashimoto

(10) Patent No.: US 7,186,584 B2
(45) Date of Patent: Mar. 6, 2007

(54) INTEGRATED CIRCUIT CHIP, ELECTRONIC DEVICE AND METHOD OF MANUFACTURING THE SAME, AND ELECTRONIC INSTRUMENT

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 116 days.

(21) Appl. No.: 11/099,390

(22) Filed: Apr. 4, 2005

(65) Prior Publication Data
US 2005/0196981 A1    Sep. 8, 2005

Related U.S. Application Data

(62) Division of application No. 10/361,839, filed on Feb. 10, 2003, now Pat. No. 6,917,104.

(30) Foreign Application Priority Data

Mar. 6, 2002    (JP)    ............... 2002-060312
Dec. 12, 2002   (JP)    ............... 2002-361118

(51) Int. Cl.
    *H01L 21/44*    (2006.01)
(52) U.S. Cl. ............... 438/108; 438/123; 438/124; 257/734; 257/778; 257/E21.511; 257/E23.065; 349/150
(58) Field of Classification Search ........ 438/117–119, 438/107–108, 123–124; 257/778; 349/148–152
See application file for complete search history.

(56) References Cited

U.S. PATENT DOCUMENTS

| 653,205 | A | 7/1900 | Behrend ................... 299/9 |
| 5,818,561 | A * | 10/1998 | Nakanishi ................ 349/149 |
| 5,923,119 | A | 7/1999 | Hara et al. ................ 313/506 |
| 6,043,971 | A | 3/2000 | Song et al. |
| 6,052,171 | A | 4/2000 | Kawagushi ................ 349/149 |
| 6,163,070 | A | 12/2000 | Mori |
| 6,198,522 | B1 | 3/2001 | Yanagi ...................... 349/152 |
| 6,300,997 | B1 | 10/2001 | Saito et al. ................ 349/149 |
| 6,356,333 | B1 | 3/2002 | Uchiyama ................. 349/149 |
| 6,424,400 | B1 | 7/2002 | Kawasaki .................. 349/149 |
| 6,456,344 | B1 | 9/2002 | Nemoto et al. ............ 349/64 |
| 6,456,353 | B1 * | 9/2002 | Chen ......................... 349/150 |
| 6,519,021 | B1 | 2/2003 | Aruga ....................... 349/152 |
| 6,556,268 | B1 | 4/2003 | Lee et al. .................. 349/149 |
| 6,587,164 | B2 | 7/2003 | Onisawa et al. ........... 349/43 |
| 6,597,416 | B1 | 7/2003 | Momose .................... 349/60 |

(Continued)

FOREIGN PATENT DOCUMENTS

CN    1291789    4/2001

(Continued)

*Primary Examiner*—Thao X. Le
(74) *Attorney, Agent, or Firm*—Hogan & Hartson LLP

(57) ABSTRACT

First and second electrodes and first and second electrical connection portions are overlapped and electrically connected. A first substrate includes: an attachment portion, a connection portion and an extension portion, the attachment portion being attached to the second substrate, the connection portion being connected to the attachment portion and positioned outside the second substrate, and the extension portion being extending from the connection portion along an edge of the second substrate without overlapping the second substrate. The first electrical connection sections are formed on the extension portion of the first substrate.

6 Claims, 11 Drawing Sheets

U.S. PATENT DOCUMENTS

| | | | |
|---|---|---|---|
| 6,618,111 B1 * | 9/2003 | Nagata et al. | 349/149 |
| 6,621,547 B2 | 9/2003 | Kang | 349/151 |
| 6,624,868 B1 | 9/2003 | Terukina et al. | 349/149 |
| 6,638,790 B2 | 10/2003 | Minamio et al. | |
| 6,646,708 B1 | 11/2003 | Muramatsu | 349/149 |
| 6,657,606 B2 | 12/2003 | Kang et al. | 345/87 |
| 6,665,037 B2 | 12/2003 | Hagiwara | 349/148 |
| 6,670,706 B2 | 12/2003 | Ikegami | 257/734 |
| 6,686,227 B2 * | 2/2004 | Zhou et al. | 438/127 |
| 6,686,987 B1 | 2/2004 | Sakaki et al. | 349/149 |
| 6,710,838 B2 | 3/2004 | Sakai et al. | 349/149 |
| 6,738,123 B1 * | 5/2004 | Takahashi et al. | 349/152 |
| 2001/0002145 A1 | 5/2001 | Lee et al. | 349/58 |

FOREIGN PATENT DOCUMENTS

| | | |
|---|---|---|
| JP | 03-004546 | 1/1991 |
| JP | 07-249657 | 9/1995 |
| JP | 07-321152 | 12/1995 |
| JP | 09-026588 | 1/1997 |
| JP | 09-033940 | 2/1997 |
| JP | 09-152621 | 6/1997 |
| JP | 10-335580 | 12/1998 |

* cited by examiner

INTEGRATED CIRCUIT CHIP, ELECTRONIC DEVICE AND METHOD OF MANUFACTURING THE SAME, AND ELECTRONIC INSTRUMENT

This is a divisional of application Ser. No. 10/361,839 filed Feb. 10, 2003 now U.S. Pat. No. 6,917,104, which application is hereby incorporated by reference in its entirety.

Japanese Patent Application No. 2002-60312, filed on Mar. 6, 2002, and Japanese Patent Application No. 2002-361118, filed on Dec. 12, 2002, are hereby incorporated by reference in their entirety.

BACKGROUND OF THE INVENTION

The present invention relates to an integrated circuit chip, to an electronic device and method of manufacturing the same, and to an electronic instrument.

For electrically connecting an IC chip having a drive circuit to a liquid crystal panel, TAB (Tape Automated Bonding) or COF (Chip On Film) mounting is applied. This entails that there are bonding portions between the interconnecting pattern formed on the tape or film and the IC chip, and bonding portions between the interconnecting pattern formed on the tape or film and the interconnecting pattern of the liquid crystal panel. In COG (Chip On Glass) mounting, for the purpose of electrical connection to a circuit board, a tape or film on which an interconnecting pattern is formed is attached to the liquid crystal panel. Therefore, COG mounting entails bonding portions between the liquid crystal panel interconnecting pattern and the IC chip, and bonding portions between the interconnecting pattern formed on the tape or film and the liquid crystal panel interconnecting pattern. Thus, conventional TAB, COF, or COG mounting entails a large number of bonding portions.

BRIEF SUMMARY OF THE INVENTION

The electronic device according to an aspect of the present invention includes:

an integrated circuit chip having first and second electrodes;

a first substrate on which is formed a first interconnecting pattern having first electrical connection sections; and a second substrate on which is formed a second interconnecting pattern having second electrical connection sections, wherein the first electrodes and the first electrical connection sections are overlapped and electrically connected, wherein the second electrodes and the second electrical connection sections are overlapped and electrically connected, wherein the first substrate includes: an attachment portion, a connection portion and an extension portion, the attachment portion being attached to the second substrate, the connection portion being connected to the attachment portion and positioned outside the second substrate, and the extension portion being extending from the connection portion along an edge of the second substrate without overlapping the second substrate, and wherein the first electrical connection sections are formed on the extension portion of the first substrate.

The electronic device according to another aspect of the present invention includes:

an integrated circuit chip having first and second electrodes;

a first substrate on which is formed a first interconnecting pattern having first electrical connection sections; and a second substrate on which is formed a second interconnecting pattern having second electrical connection sections, wherein an end portion of the first substrate, an end portion of the second substrate, and the integrated circuit chip are disposed so as to overlap, wherein the second substrate has a step formed so that at least a part of a surface of the end portion is lowered;

wherein the end portion of the first substrate is attached to the lowered surface of the second substrate, wherein the first electrodes and the first electrical connection sections are overlapped and electrically connected, and wherein the second electrodes and the second electrical connection sections are overlapped and electrically connected.

The electronic device according to a further aspect of the present invention includes:

an integrated circuit chip having first and second electrodes;

a first substrate on which is formed a first interconnecting pattern having first electrical connection sections; and a second substrate on which is formed a second interconnecting pattern having second electrical connection sections, wherein the first substrate, the second substrate, and the integrated circuit chip are disposed so as to overlap, wherein the first electrodes and the first electrical connection sections are overlapped and electrically connected, wherein the second electrodes and the second electrical connection sections are overlapped and electrically connected, and wherein the integrated circuit chip is disposed at an incline with respect to a part of the first substrate in which the first electrical connection sections are formed and a part of the second substrate in which the second electrical connection sections are formed.

The electronic device according to a still further aspect of the present invention includes:

a substrate on which is formed an interconnecting pattern; and an integrated circuit chip having a plurality of electrodes and mounted on the substrate, the electrodes electrically connected to the interconnecting pattern, wherein the integrated circuit chip is disposed so that a surface on which the electrodes are provided is not parallel to a surface of the substrate on which the interconnecting pattern is formed.

The integrated circuit chip according to a still further aspect of the present invention has a plurality of electrodes formed as bumps, and with top surfaces inclined.

The electronic device according to a still further aspect of the present invention has the above described integrated circuit chip.

The electronic instrument according to a still further aspect of the present invention has the above described electronic device.

The method of manufacturing an electronic device according to a still further aspect of the present invention includes:

(a) positioning first electrical connection sections of a first interconnecting pattern and first electrodes of an integrated circuit chip so as to overlap each other, and electrically connecting the first electrical connection sections and the first interconnecting pattern, the first interconnecting pattern being formed on a first substrate;

(b) positioning second electrical connection sections of a second interconnecting pattern and second electrodes of an integrated circuit chip so as to overlap each other, and electrically connecting the second electrical connection sections and the second interconnecting pattern, the second interconnecting pattern being formed on a second substrate; and (c) attaching an attachment portion of the first substrate to the second substrate, wherein the first substrate includes: a connection portion and an extension portion, the connection portion being connected to the attachment portion and positioned outside the second substrate, and the extension portion being extending from the connection portion along an edge of the second substrate without overlapping the second substrate, and wherein the first electrical connection sections are formed on the extension portion of the first substrate.

The method of manufacturing an electronic device according to an even further aspect of the present invention includes:

(a) positioning first electrical connection sections of a first interconnecting pattern and first electrodes of an integrated circuit chip so as to overlap each other, and electrically connecting the first electrical connection sections and the first interconnecting pattern, the first interconnecting pattern being formed on a first substrate;

(b) positioning second electrical connection sections of a second interconnecting pattern and second electrodes of an integrated circuit chip so as to overlap each other, and electrically connecting the second electrical connection sections and the second interconnecting pattern, the second interconnecting pattern being formed on a second substrate; and (c) attaching an end portion of the first substrate to an end portion of the second substrate, wherein a step is formed in the second substrate so that a surface of the end portion of the second substrate overlapping the first substrate is lowered, and the end portion of the first substrate is attached to the lowered surface of the second substrate.

The method of manufacturing an electronic device according to a yet further aspect of the present invention includes:

(a) positioning first electrical connection sections of a first interconnecting pattern and first electrodes of an integrated circuit chip so as to overlap each other, and electrically connecting the first electrical connection sections and the first interconnecting pattern, the first interconnecting pattern being formed on a first substrate;

(b) positioning second electrical connection sections of a second interconnecting pattern and second electrodes of an integrated circuit chip so as to overlap each other, and electrically connecting the second electrical connection sections and the second interconnecting pattern, the second interconnecting pattern being formed on a second substrate; and (c) attaching an attachment portion of the first substrate to the second substrate, wherein the integrated circuit chip is disposed at an incline with respect to a part of the first substrate in which the first electrical connection sections are formed and a part of the second substrate in which the second electrical connection sections are formed.

The method of manufacturing an electronic device according to an even more further aspect of the present invention includes:

mounting an integrated circuit chip having a plurality of electrodes on a substrate on which is formed an interconnecting pattern, wherein the integrated circuit chip is disposed so as to avoid a surface on which the electrodes are provided being positioned parallel to a surface of the substrate on which the interconnecting pattern is formed.

DETAILED DESCRIPTION OF THE EMBODIMENT

Figure 1:
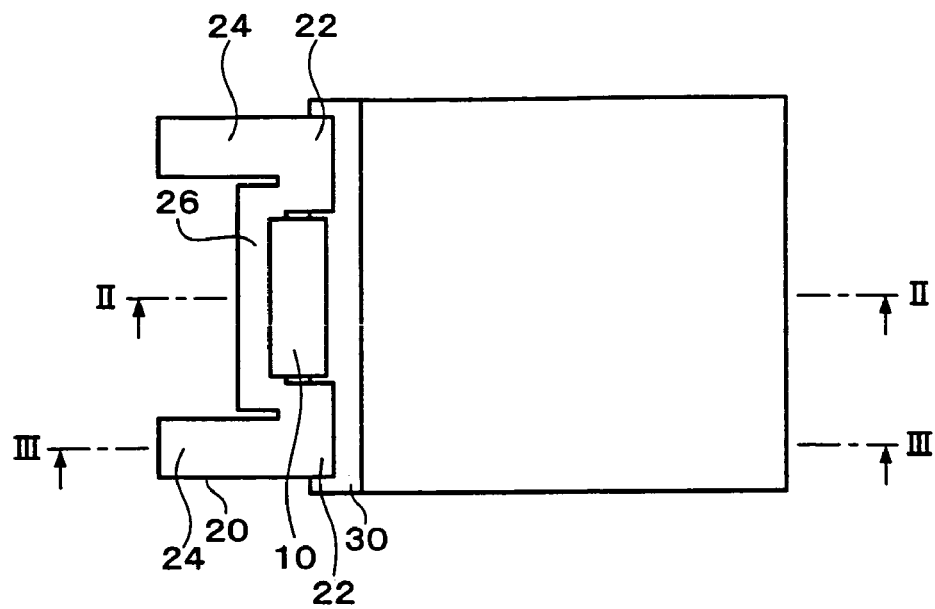
FIG. 1 shows an electronic device of a first embodiment of the present invention.

Embodiments of the present invention may provide an integrated circuit chip of high reliability, an electronic device and method of manufacturing the same, and an electronic instrument.

(1) An electronic device according to an embodiment of the present invention includes:

an integrated circuit chip having first and second electrodes;

a first substrate on which is formed a first interconnecting pattern having first electrical connection sections; and a second substrate on which is formed a second interconnecting pattern having second electrical connection sections, wherein the first electrodes and the first electrical connection sections are overlapped and electrically connected, wherein the second electrodes and the second electrical connection sections are overlapped and electrically connected, wherein the first substrate includes: an attachment portion, a connection portion and an extension portion, the attachment portion being attached to the second substrate, the connection portion being connected to the attachment portion and positioned outside the second substrate, and the extension portion being extending from the connection portion along an edge of the second substrate without overlapping the second substrate, and wherein the first electrical connection sections are formed on the extension portion of the first substrate.

According to this embodiment of the present invention, since the first and second interconnecting patterns can be electrically connected through the integrated circuit chip, a direct bonding portion between the first and second interconnecting patterns can be reduced (and for example, eliminated), and the reliability can be improved. According to this embodiment of the present invention, since the attachment portion of the first substrate is attached to the second substrate, the coupling between the first or second substrates and the integrated circuit chip can be reinforced.

(2) In this electronic device:

a cut may be formed in the connection portion in a direction intersecting an extending direction of the extension portion.

(3) In this electronic device:

the connection portion may be formed to project beyond the extension portion away from the second substrate.

(4) In this electronic device:

the first interconnecting pattern may have terminals for electrical connection to an electronic component other than the integrated circuit chip, and the terminals may be formed on the connection portion.

(5) In this electronic device:

the attachment portion may be attached to a surface of the second substrate on which the second interconnecting pattern is formed.

(6) In this electronic device:

the attachment portion may be attached to a surface of the second substrate opposite to a surface on which the second interconnecting pattern is formed.

(7) In this electronic device:

the first substrate may have a plurality of the attachment portions.

(8) In this electronic device:

the plurality of attachment portions may be formed on two opposed sides of the extension portion.

(9) An electronic device according to another embodiment of the present invention includes:

an integrated circuit chip having first and second electrodes;

a first substrate on which is formed a first interconnecting pattern having first electrical connection sections; and a second substrate on which is formed a second interconnecting pattern having second electrical connection sections, wherein an end portion of the first substrate, an end portion of the second substrate, and the integrated circuit chip are disposed so as to overlap, wherein the second substrate has a step formed so that at least a part of a surface of the end portion is lowered;

wherein the end portion of the first substrate is attached to the lowered surface of the second substrate, wherein the first electrodes and the first electrical connection sections are overlapped and electrically connected, and wherein the second electrodes and the second electrical connection sections are overlapped and electrically connected.

According to this embodiment of the present invention, since the first and second interconnecting patterns can be electrically connected through the integrated circuit chip, a direct bonding portion between the first and second interconnecting patterns can be reduced (and for example, eliminated), and the reliability can be improved. According to this embodiment of the present invention, the end portion of the first substrate, the end portion of the second substrate, and the integrated circuit chip are overlapped, and therefore the electronic device can be made more compact.

(10) In this electronic device:

the first and second substrates may be disposed so that the surfaces of the first and second interconnecting patterns are substantially coplanar.

(11) An electronic device according to a further embodiment of the present invention includes:

an integrated circuit chip having first and second electrodes;

a first substrate on which is formed a first interconnecting pattern having first electrical connection sections; and a second substrate on which is formed a second interconnecting pattern having second electrical connection sections, wherein the first substrate, the second substrate, and the integrated circuit chip are disposed so as to overlap, wherein the first electrodes and the first electrical connection sections are overlapped and electrically connected, wherein the second electrodes and the second electrical connection sections are overlapped and electrically connected, and wherein the integrated circuit chip is disposed at an incline with respect to a part of the first substrate in which the first electrical connection sections are formed and a part of the second substrate in which the second electrical connection sections are formed.

According to this embodiment of the present invention, since the first and second interconnecting patterns can be electrically connected through the integrated circuit chip, a direct bonding portion between the first and second interconnecting patterns can be reduced (and for example, eliminated), and the reliability can be improved. According to this embodiment of the present invention, since the first substrate, the second substrate, and the integrated circuit chip are overlapped, the electronic device can be made more compact.

(12) In this electronic device:
pitch of the first electrical connection sections may be wider than pitch of the second electrical connection sections.

(13) In this electronic device:
the first substrate may have a greater deformation rate due to at least one of heat and humidity than the second substrate.

(14) In this electronic device:
the first substrate may be a flexible substrate.

(15) In this electronic device:
the first substrate may be a glass substrate.

(16) In this electronic device:
a thickness of the first substrate may be less than a thickness of the second substrate.

(17) In this electronic device:
the second substrate may be part of an electro-optic panel.

(18) This electronic device may further includes:
a resin with which between the first and second substrates is filled.

(19) An electronic device according to a still further embodiment of the present invention includes:
a substrate on which is formed an interconnecting pattern; and
an integrated circuit chip having a plurality of electrodes and mounted on the substrate, the electrodes electrically connected to the interconnecting pattern,
wherein the integrated circuit chip is disposed so that a surface on which the electrodes are provided is not parallel to a surface of the substrate on which the interconnecting pattern is formed.

According to this embodiment of the present invention, the integrated circuit chip is disposed being inclined to the substrate. Therefore, the projected area of the integrated circuit chip can be reduced, and an electronic device can be provided in which an integrated circuit chip and the like is mounted at a high density.

(20) In this electronic device:
the top surfaces of the electrodes may be inclined.

(21) In this electronic device:
the top surfaces of the electrodes may be disposed in substantially the same plane.

(22) An integrated circuit chip according to a still further embodiment of the present invention has a plurality of electrodes formed as bumps, top surfaces of the electrodes being inclined.

According to this embodiment, the area of the top surfaces of the electrodes of the integrated circuit chip is increased. Therefore, the contact area with a substrate or the like is increased, and an integrated circuit chip with high electrical connection stability can be provided.

(23) In this integrated circuit chip:
the top surfaces of the electrodes may be disposed in substantially the same plane.

(24) An electronic device according to a still further embodiment of the present invention includes the above described integrated circuit chip.

(25) An electronic instrument according to a still further embodiment of the present invention has the above described electronic device.

(26) A method of manufacturing an electronic device according to a still further embodiment of the present invention includes:
(a) positioning first electrical connection sections of a first interconnecting pattern and first electrodes of an integrated circuit chip so as to overlap each other, and electrically connecting the first electrical connection sections and the first interconnecting pattern, the first interconnecting pattern being formed on a first substrate;
(b) positioning second electrical connection sections of a second interconnecting pattern and second electrodes of an integrated circuit chip so as to overlap each other, and electrically connecting the second electrical connection sections and the second interconnecting pattern, the second interconnecting pattern being formed on a second substrate; and
(c) attaching an attachment portion of the first substrate to the second substrate,
wherein the first substrate includes: a connection portion and an extension portion, the connection portion being connected to the attachment portion and positioned outside the second substrate, and the extension portion being extending from the connection portion along an edge of the second substrate without overlapping the second substrate, and
wherein the first electrical connection sections are formed on the extension portion of the first substrate.

According to this embodiment of the present invention, since the first and second interconnecting patterns can be electrically connected through the integrated circuit chip, a direct bonding portion between the first and second interconnecting patterns can be reduced (and for example, eliminated), and the reliability can be improved. According to this embodiment of the present invention, since the attachment portion of the first substrate is attached to the second substrate, the coupling between the first or second substrates and the integrated circuit chip can be reinforced.

(27) A method of manufacturing an electronic device according to an even further embodiment of the present invention includes:
(a) positioning first electrical connection sections of a first interconnecting pattern and first electrodes of an integrated circuit chip so as to overlap each other, and electrically connecting the first electrical connection sections and the first interconnecting pattern, the first interconnecting pattern being formed on a first substrate;
(b) positioning second electrical connection sections of a second interconnecting pattern and second electrodes of an integrated circuit chip so as to overlap each other, and electrically connecting the second electrical connection sections and the second interconnecting pattern, the second interconnecting pattern being formed on a second substrate; and
(c) attaching an end portion of the first substrate to an end portion of the second substrate,
wherein a step is formed in the second substrate so that a surface of the end portion of the second substrate overlapping the first substrate is lowered, and the end portion of the first substrate is attached to the lowered surface of the second substrate.

According to this embodiment of the present invention, since the first and second interconnecting patterns can be electrically connected through the integrated circuit chip, a direct bonding portion between the first and second interconnecting patterns can be reduced (and for example, eliminated), and the reliability can be improved. According to this embodiment of the present invention, since the end portion of the first substrate, the end portion of the second substrate, and the integrated circuit chip are overlapped, the electronic device can be made more compact.

(28) A method of manufacturing an electronic device according to a yet further embodiment of the present invention includes:

(a) positioning first electrical connection sections of a first interconnecting pattern and first electrodes of an integrated circuit chip so as to overlap each other, and electrically connecting the first electrical connection sections and the first interconnecting pattern, the first interconnecting pattern being formed on a first substrate;

(b) positioning second electrical connection sections of a second interconnecting pattern and second electrodes of an integrated circuit chip so as to overlap each other, and electrically connecting the second electrical connection sections and the second interconnecting pattern, the second interconnecting pattern being formed on a second substrate; and (c) attaching an attachment portion of the first substrate to the second substrate, wherein the integrated circuit chip is disposed at an incline with respect to a part of the first substrate in which the first electrical connection sections are formed and a part of the second substrate in which the second electrical connection sections are formed.

According to this embodiment of the present invention, since the first and second interconnecting patterns can be electrically connected through the integrated circuit chip, a direct bonding portion between the first and second interconnecting patterns can be reduced (and for example, eliminated), and the reliability can be improved. According to this embodiment of the present invention, since the end portion of the first substrate, the end portion of the second substrate, and the integrated circuit chip are overlapped, the electronic device can be made more compact.

(29) In this method of manufacturing the electronic device:

a top surface of each electrode in at least the second electrodes may be inclined.

(30) In this method of manufacturing the electronic device:

the step (b) may be carried out after carrying out the step (a).

(31) In this method of manufacturing the electronic device:

the steps (a) and (b) may be carried out simultaneously, after carrying out the step (c).

(32) In this method of manufacturing the electronic device:

the step (a) may be carried out after carrying out the step (c), then the step (b) may be carried out.

(33) In this method of manufacturing the electronic device:

the steps (b) and (c) may be carried out simultaneously, after carrying out the step (a).

(34) A method of manufacturing an electronic device according to an even more further embodiment of the present invention includes:

mounting an integrated circuit chip having a plurality of electrodes on a substrate on which is formed an interconnecting pattern, wherein the integrated circuit chip is disposed so as to avoid a surface on which the electrodes are provided being positioned parallel to a surface of the substrate on which the interconnecting pattern is formed.

According to this embodiment of the present invention, the integrated circuit chip is disposed being inclined to the substrate. Therefore, the projected area of the integrated circuit chip can be reduced, and an electronic device can be manufactured in which an integrated circuit chip and the like is mounted at a high density.

(35) In this method of manufacturing the electronic device:

a top surfaces of the electrodes may be previously inclined.

(36) In this method of manufacturing the electronic device:

the top surfaces of the electrodes may be each disposed substantially in the same plane.

The embodiments of the present invention is now described, with reference to the drawings.

First Embodiment

Figure 2:
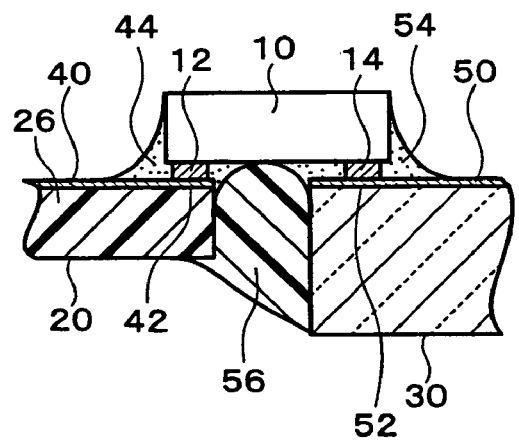
FIG. 2 is an enlarged partial section along the line II—II in FIG. 1.
Figure 3:
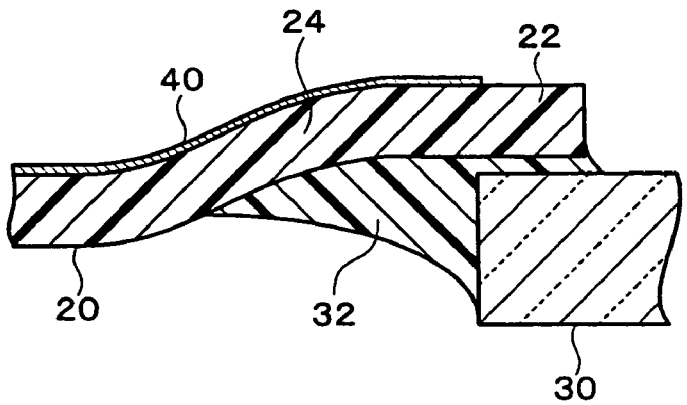
FIG. 3 is an enlarged partial section along the line III—III in FIG. 1.
Figure 4:
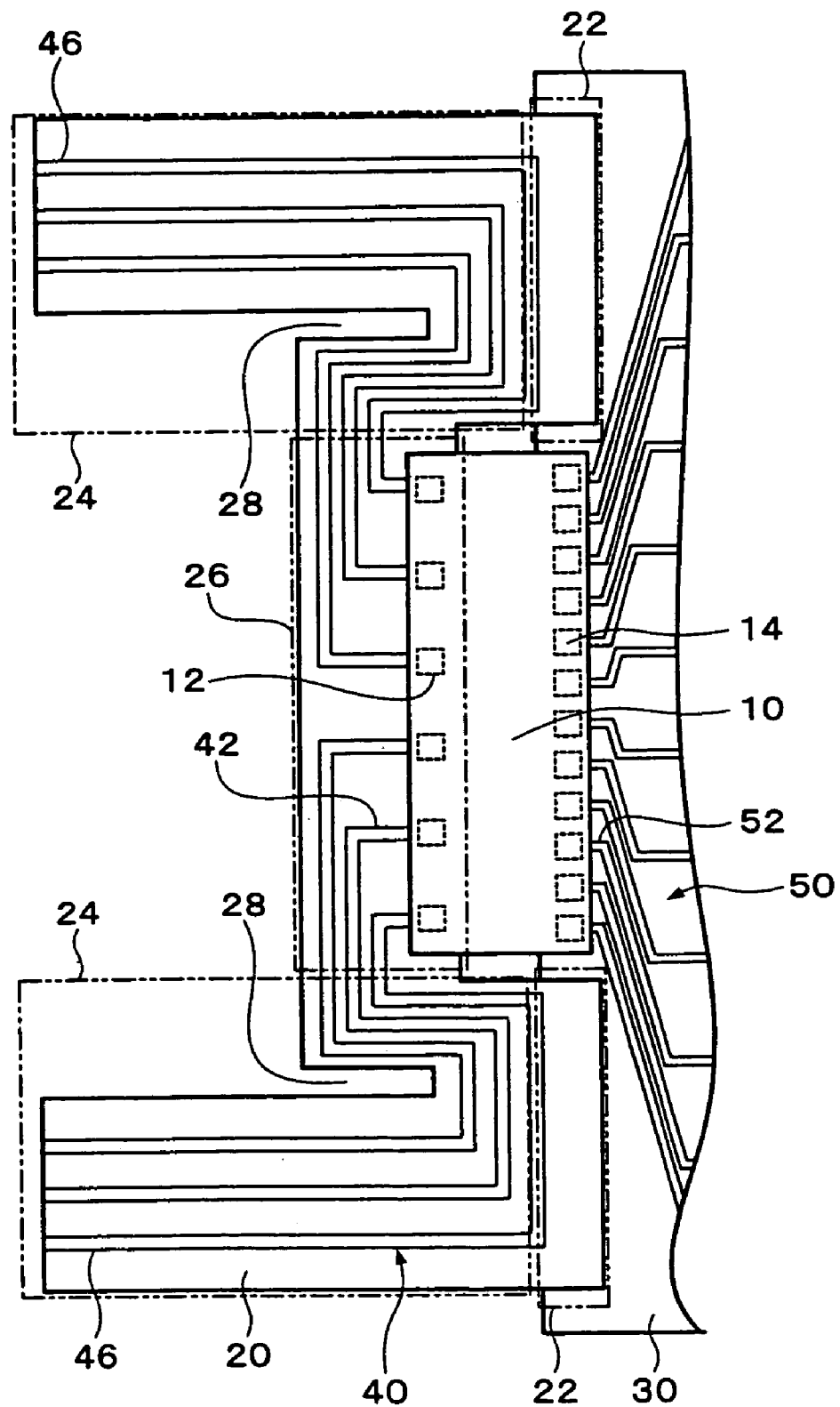
FIG. 4 is an enlarged partial view of the electronic device shown in FIG. 1.

FIG. 1 shows the first embodiment of the electronic device of the present invention. FIG. 2 is an enlarged partial section along the line II—II in FIG. 1, and FIG. 3 is an enlarged partial section along the line III—III in FIG. 1. FIG. 4 is an enlarged partial view of the electronic device shown in FIG. 1.

The electronic device has an integrated circuit chip (IC chip) 10. The integrated circuit chip 10 is a semiconductor chip. The integrated circuit chip 10 may be a rectangular parallelepiped (oblong in plan view). The integrated circuit chip 10 has at least first electrodes 12 and second electrodes 14 (see FIG. 4). In this embodiment, of two parallel edges of the integrated circuit chip 10 (for example, the long edges of the oblong seen in plan view) the first row of electrodes 12 may be arranged along one edge, and the second row of electrodes 14 arranged along the other edge. With regard to the electrode arrangement, the integrated circuit chip 10 is of the peripheral type. Each of the first electrodes 12 and second electrodes 14 may include, for example, a pad formed of aluminum or the like, and a bump or the like of gold or the like formed thereon. In this case, between the pad and the bump or the like may be further included a metal layer of an under-bump metal or the like, formed of TiW, Pt, or the like.

As shown in FIG. 4, the pitch of the first electrodes 12 is wider than the pitch of the second electrodes 14. The integrated circuit chip 10 has an internal driver (for example, a drive circuit for an electro-optic panel (liquid crystal panel or electroluminescence panel or the like)). In this embodiment, the first electrodes 12 constitute input terminals to the driver, and the second electrodes 14 constitute output terminals from the driver.

The electronic device has a first substrate 20. The first substrate 20 may be a flexible substrate or a film. The first substrate 20 may be formed of a material (for example, polyimide or similar resin) having a deformation rate due to at least one of heat and humidity (thermal expansion rate or the like) greater than that of a second substrate 30. The first substrate 20 may be thinner than the second substrate 30.

The first substrate 20 has at least one (a plurality or one) attachment portion 22 for attaching to the second substrate 30. The attachment portion 22 is the part of the first substrate 20 for attaching to the second substrate 30, and may be provided in a region in which first electrical connection sections 42 are not formed. The second substrate 30 and attachment portion 22 may be adhered (or fixed) together. For this adhesion or fixing, as shown in FIG. 3, a resin (for example, an adhesive) 32 may be used. The resin 32 may be provided only between the second substrate 30 and the attachment portion 22, or may be provided to extend between the first substrate 20 (for example, a connection portion 24) and the second substrate 30 (for example, the top surface thereof). The attachment portion 22 may be attached to the surface of the second substrate 30 on which a second interconnecting pattern 50 is formed. In this case, the attachment portion 22 and the second interconnecting pattern 50 may overlap. In the example shown in FIG. 4, attachment portions 22 are positioned on both sides of an extension portion 26.

The first substrate 20 has a connection portion 24 connected to the attachment portion 22 and positioned outside the second substrate 30. In the example shown in FIG. 4, a pair of attachment portions 22 are positioned spaced apart, and from each attachment portion 22 a connection portion 24 is formed. The connection portion 24 may be formed to project further in the direction remote from the second substrate 30 than the extension portion 26. In the connection portion 24 may be formed a cut 28 in a direction intersecting (for example, perpendicular to) the direction of extension of the extension portion 26 (for example, in a direction intersecting (for example, perpendicular to) the edge of the second substrate 30 to which the attachment portion 22 is attached). By virtue of the formation of the cut 28, when the connection portion 24 is bent, the extension portion 26 is less liable to be bent. The cut 28 may be formed to extend from that part of the end portion of the connection portion 24 being an end portion having the edges adjacent to and the edge opposing the attachment portion 22 as far as the attachment portion 22. By virtue of the formation of such a cut 28, when the connection portion 24 is bent, the extension portion 26 is even less likely to be bent, and therefore, mechanical damage to the first electrodes 12 of the integrated circuit chip 10, and the first connection portion 24 of the first substrate 20 can be reduced.

The first substrate 20 has the extension portion 26, which extends along the edge of the second substrate 30 from the connection portion 24. In the example shown in FIG. 4, the extension portion 26 is positioned between the pair of connection portions 24. The extension portion 26 includes the region where the first electrical connection sections 42 are formed, and at least a part of the mounting region of the integrated circuit chip 10. The region in which these first electrical connection sections 42 are formed, and at least apart of the mounting region of the integrated circuit chip 10 is so as not to overlap the second substrate 30. The extension portion 26 may, in the region in which these first electrical connection sections 42 are formed, and in at least a part of the mounting region of the integrated circuit chip 10, be spaced apart from the second substrate 30.

On the first substrate 20, a first interconnecting pattern 40 is formed. The first substrate 20 on which the first interconnecting pattern 40 is formed may be an interconnecting line substrate. The first interconnecting pattern 40 is formed on at least the extension portion 26, and may be formed to reach the connection portion 24. The first interconnecting pattern 40 may be formed to pass along the attachment portion 22, or may be formed to avoid the attachment portion 22.

The first interconnecting pattern 40 has a plurality of first electrical connection sections 42. The pitch of the first electrical connection sections 42 is wider than that of second electrical connection sections 52. The first electrical connection sections 42 are positioned on the extension portion 26. The first electrical connection sections 42 overlap and are electrically connected to the first electrodes 12 of the integrated circuit chip 10. For the electrical connection, an insulating resin bond (for example, a bond using NCP (non-conductive paste), NCF (non-conductive film), or the like), an anisotropic conducting material bond (for example a bond using ACF (anisotropic conductive film) or the like), an alloy bond (for example Au—Au or Au—Sn bond or the like), a solder bond or any suchlike known bonding method may be applied. A part of the integrated circuit chip 10 is mounted on the first substrate 20. Between the integrated circuit chip 10 and first substrate 20, an underfill material 44 may be provided. The underfill material 44 may double as NCP, NCF, or ACF.

In the example shown in FIG. 4, of the plurality of first electrical connection sections 42, the first interconnecting pattern 40 includes interconnecting lines extending from a first group of the first electrical connection sections 42 to one connection portion 24, and interconnecting lines extending from a second group of the first electrical connection sections 42 (the remainder of the first electrical connection sections 42) to the other connection portion 24.

The first interconnecting pattern 40 may have terminals 46 for electrically connecting to electronic components not shown in the drawings (circuit board (motherboard) or the like) other than the integrated circuit chip 10. The terminals 46 are formed on the connection portion 24 (for example, at the end portion thereof). The terminals 46 are electrically connected to the first electrical connection sections 42. On the first substrate 20, electronic components not shown in the drawings other than the integrated circuit chip 10 (for example, surface mounting components) may be mounted.

The electronic device has a second substrate 30. The second substrate 30 may be, for example, a glass substrate. The second substrate 30 may be part of an electro-optic panel (liquid crystal panel, electroluminescence panel, or the like). On the second substrate 30, the second interconnecting pattern 50 is formed. It should be noted that in the case of a liquid crystal panel, the second interconnecting pattern 50 is electrically connected to electrodes (scan electrodes, signal electrodes, opposing electrodes, and the like) for driving the liquid crystal. The second interconnecting pattern 50 may be formed of ITO (Indium Tin Oxide), Al, Cr, Ta or similar metal films, or metal compound films.

The second interconnecting pattern 50 has a plurality of the second electrical connection sections 52. The pitch of the second electrical connection sections 52 is formed to be narrower than that of the first electrical connection sections 42. The second electrical connection sections 52 are positioned at the end portion of the second substrate 30. The second interconnecting pattern 50 may be formed so that the pitch widens from the second electrical connection sections 52. The second electrical connection sections 52 overlap and are electrically connected to the second electrodes 14 of the integrated circuit chip 10. For the electrical connection, an insulating resin bond (for example, a bond using NCP (non-conductive paste), NCF (non-conductive film), or the like), an anisotropic conducting material bond (for example a bond using ACF (anisotropic conductive film) or the like), an alloy bond (for example Au—Au or Au—Sn bond or the like), a solder bond or any suchlike known bonding method may be applied. A part of the integrated circuit chip 10 is mounted on the second substrate 30. Between the integrated circuit chip 10 and second substrate 30, an underfill material 54 may be provided. The underfill material 54 may double as NCP, NCF, or ACF.

Between the first and second substrates 20 and 30, as shown in FIG. 2, a gap may be provided. That is to say, the first and second substrates 20 and 30 may, as shown in FIG. 2, be provided spaced apart. The size of this gap may be such as, as described below, to be filled with a resin 56. The integrated circuit chip 10 is mounted so as span between the first substrate 20 (more precisely the extension portion 26) and the second substrate 30. Between the first substrate 20 (more precisely the extension portion 26) and the second substrate 30 may be filled with the resin 56. By means of the resin 56, between the first and second substrates 20 and 30 the surface of the integrated circuit chip 10 on which the first and second electrodes 12 and 14 are formed is covered.

According to this embodiment, since the first and second interconnecting patterns 40 and 50 can be electrically connected with the integrated circuit chip 10 interposed, a direct bonding portion between the first and second interconnecting patterns 40 and 50 can be reduced (for example, eliminated), and the reliability can be improved. According to this embodiment, since the attachment portion 22 of the first substrate 20 is attached to the second substrate 30, the coupling between the first and second substrates 20 and 30 and the integrated circuit chip 10 can be reinforced.

Figure 5:
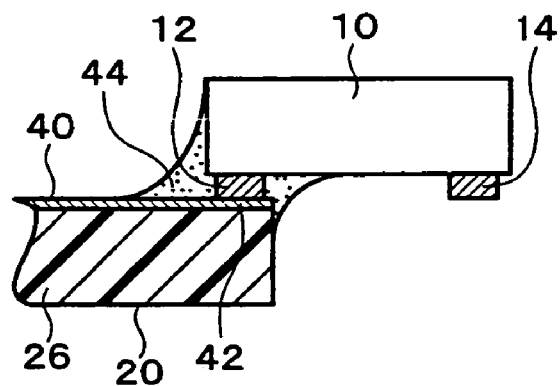
FIG. 5 illustrates the method of manufacturing the first embodiment of the present invention electronic device.

The electronic device of this embodiment is constructed as described above, and an example of the method of manufacturing the same is now described. As shown in FIG. 5, in the method of manufacturing the electronic device, the first interconnecting pattern 40 (first electrical connection sections 42) and the first electrodes 12 of the integrated circuit chip 10 are positioned so as to overlap, and are electrically connected. In this process, a device for COF (Chip On Film) mounting can be used. The details of the electrical connections thereof are as described above in relation to the construction of the electronic device. Between the integrated circuit chip 10 and first substrate 20, an under-underfill material 44 may be provided.

In the process shown in FIG. 5, even if the first substrate 20 is susceptible to expansion or contraction due to at least one of heat and humidity, as shown in FIG. 4, the first electrical connection sections 42 have a wider pitch than the second electrical connection sections 52. Therefore, a reliable electrical connection between the first electrical connection sections 42 and the first electrodes 12 can be made.

Figure 6:
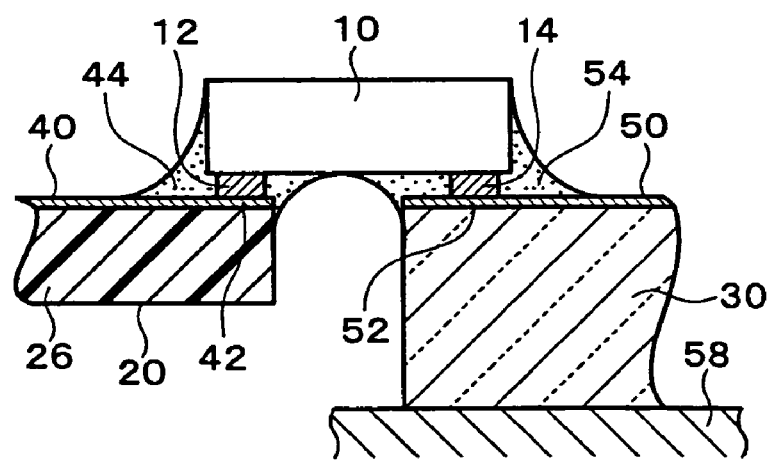
FIG. 6 illustrates the method of manufacturing the first embodiment of the present invention electronic device.

After the process shown in FIG. 5, as shown in FIG. 6, the second interconnecting pattern 50 (second electrical connection sections 52) and the second electrodes 14 of the integrated circuit chip 10 are positioned so as to overlap and are electrically connected. In this process, a device for carrying out COG (Chip On Glass) mounting can be used. The details of the electrical connection thereof are as described above in relation to the construction of the electronic device. Between the integrated circuit chip 10 and the second substrate 30, an underfill material 54 may be provided. The second electrical connection sections 52 are disposed at a narrower pitch than the first electrical connection sections 42, but the second substrate 30 is less susceptible to deformation due to at least one of heat and humidity than the first substrate 20. Therefore, the second electrical connection sections 52 and the second electrodes 14 can be aligned with high positional accuracy.

At the time at which the integrated circuit chip 10 is mounted on the second substrate 30, the integrated circuit chip 10 is already mounted on the first substrate 20, but in this embodiment, the first substrate 20 is a flexible substrate. In this case, since the first substrate 20 is flexible, the second electrical connection sections 52 and second electrodes 14 can be electrically connected without applying any stress to the electrical connection sections between the first electrical connection sections 42 and the first electrodes 12. In this embodiment, the first substrate 20 is thinner than the second substrate 30. Therefore, by placing the second substrate 30 on a level base 58, the second electrical connection sections 52 and second electrodes 14 can be electrically connected. Thus, in this embodiment, the operability is excellent. Since only that part of the integrated circuit chip 10 in which the second electrodes 14 are provided is mounted on the second substrate 30, the mounting region (so-called "border") of the second substrate 30 can be made smaller.

In this embodiment, the attachment portion 22 of the first substrate 20 is attached to the second substrate 30. The details of this attachment are as described above in relation to the construction of the electronic device. Then if required, as shown in FIG. 2, filling with a resin 56 can be carried out. The resin 56 covers the surface of the integrated circuit chip 10 on which the first and second electrodes 12 and 14 are formed, between the first and second substrates 20 and 30. The resin 56 may cover the lateral surface of the integrated circuit chip 10. In this way, the electronic device can be manufactured.

In the above description, the second electrical connection sections 52 and the second electrodes 14 are electrically connected after electrically connecting the first electrical connection sections 42 and the first electrodes 12, but this order may be reversed. The electrical connection of the first and second electrical connection sections 42 and 52 and the first and second electrodes 12 and 14 may be carried out after attaching the attachment portion 22 of the first substrate 20 to the second substrate 30. The absence of restriction on the sequence of manufacturing processes also applies to the embodiments below.

Figure 7:
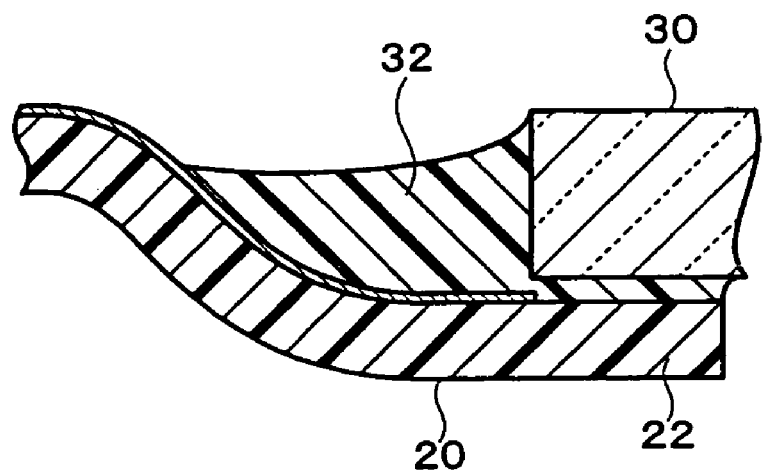
FIG. 7 shows a modification of the electronic device of the first embodiment of the present invention.

In this embodiment, as shown in FIG. 3, the attachment portion 22 is attached to the surface of the second substrate 30 on which the second interconnecting pattern 50 is formed. As a modification thereof, as shown in FIG. 7, the attachment portion 22 may be attached to the surface of the second substrate 30 opposite to that on which the second interconnecting pattern 50 is formed.

Figure 8:
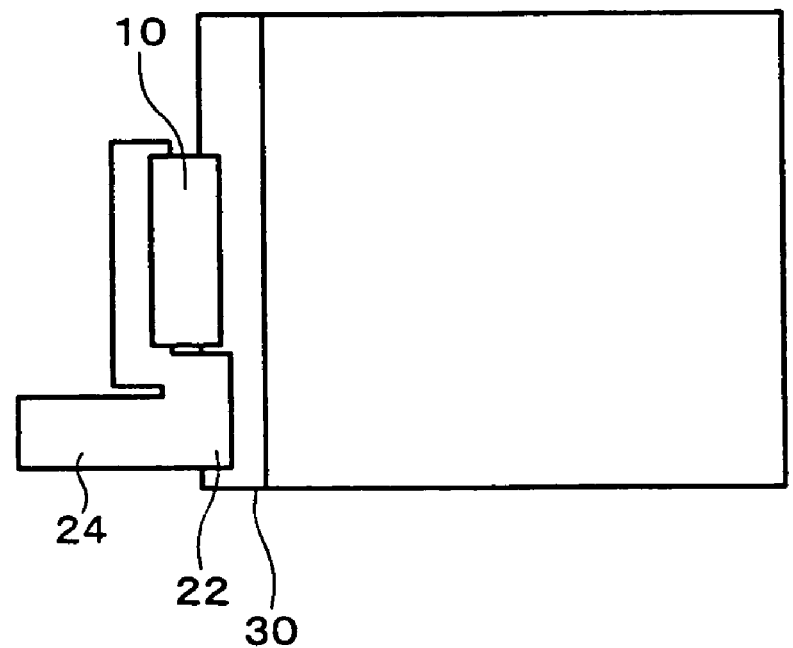
FIG. 8 shows another modification of the electronic device of the first embodiment of the present invention.

As a modification of the first substrate 20 shown in FIG. 1 having a plurality of attachment portions 22, as shown in FIG. 8, the first substrate may be constituted to have only one attachment portion 22. In this case, the first substrate has one connection portion 24. Then the first interconnecting pattern 40 (see FIG. 4) has interconnecting lines from all of the first electrical connection sections 42 (see FIG. 4) to one connection portion 24.

Second Embodiment

Figure 9:
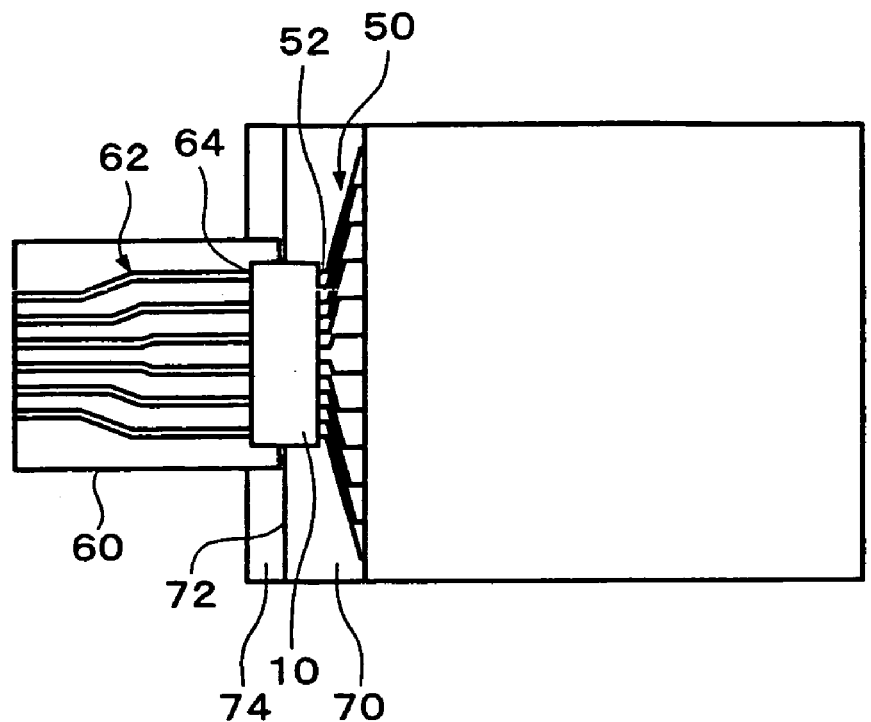
FIG. 9 shows an electronic device of the second embodiment of the present invention.
Figure 10:
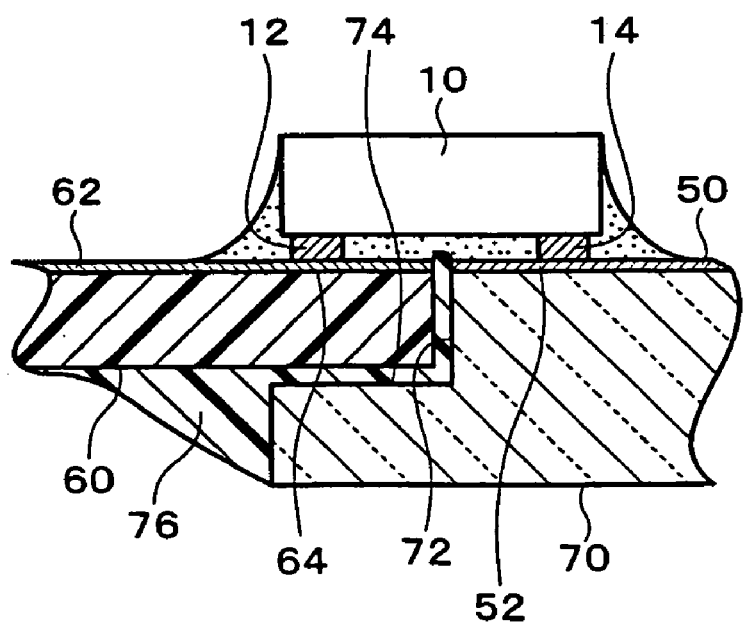
FIG. 10 is a partial sectional view of an electronic device of the second embodiment of the present invention.

FIG. 9 shows an electronic device of the second embodiment of the present invention. FIG. 10 is a partial sectional view of the electronic device of the second embodiment of the present invention. The electronic device has the integrated circuit chip 10 described in the first embodiment.

The electronic device has a first substrate 60. With regard to the material constituting the first substrate 60 and properties thereof, the details of the first substrate 20 described in the first embodiment apply. On the first substrate 60, a first interconnecting pattern 62 is formed. The first interconnecting pattern 62 has a plurality of first electrical connection sections 64. The first interconnecting pattern 62 may be formed so that the pitch becomes narrower from the first electrical connection sections 64.

The electronic device has a second substrate 70. With regard to the material constituting the second substrate 70 and properties thereof, the details of the second substrate 30 described in the first embodiment apply. On the second substrate 70, the second interconnecting pattern 50 described in the first embodiment is formed. In the second substrate 70 (for example, at the end portion thereof) a step 72 is formed. By means of the step 72, a surface 74 of part of the second substrate 70 (for example, an end portion) is lower than other parts of the surface. To this lowered surface 74, the first substrate 60 (the end portion thereof) is attached.

The step 72 may be formed in such a way that the surface of the first substrate 60 at the first interconnecting pattern 62 (for example, the first electrical connection sections 64), and the surface of the second substrate 70 at the second interconnecting pattern 50 (for example, the second electrical connection sections 52) are substantially coplanar.

Figure 11A:
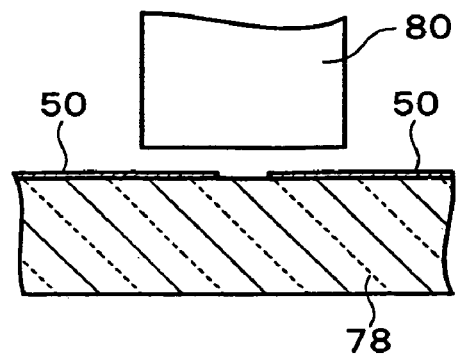
FIGS. 11A to 11C illustrate a method of forming a step in a second substrate.
Figure 11B:
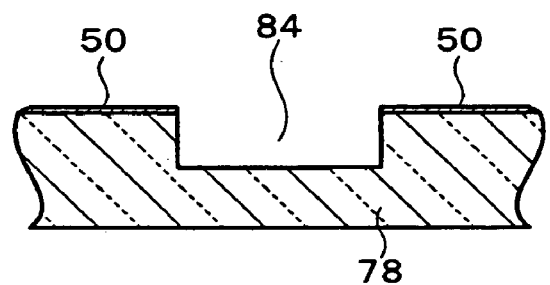
Figure 11C:
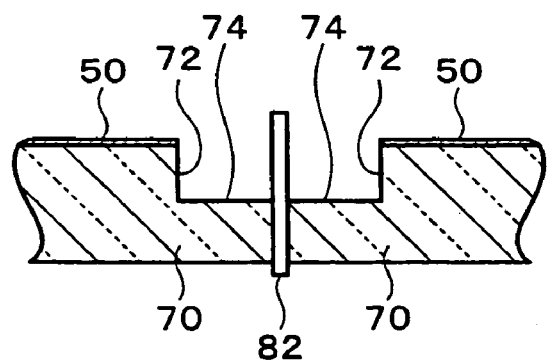

FIGS. 11A to 11C illustrate a method of forming a step in the second substrate. In this example, a substrate 78 is separated to form a plurality of the second substrates 70. As shown in FIGS. 11A and 11B, in the substrate 78, by means of a first tool 80, a groove 84 is formed in the substrate 78. Then as shown in FIG. 11C, the bottom of the groove 84 is cut by a second tool 82. Here, the first tool 80 is wider than the second tool 82. Therefore, the step 72 is formed at the end portion of the second substrate 70 obtained by cutting.

The first substrate 60 (more precisely the end portion thereof) and the surface 74 of the end portion of the second substrate 70 may be adhered (or fixed) together. For this adhesion or fixing, a resin (for example, an adhesive) 76 may be used. The resin 76 may be provided only between the first and second substrates 60 and 70, or may be provided on the first substrate 60 and on the second substrate 70 (for example, the top surfaces thereof) so as to extend therebetween. The resin 76 may be introduced between the first and second interconnecting patterns 62 and 50, to prevent electrical conduction between the two. Other aspects of the construction are the same as described in the first embodiment, for example, the description relating to the mounting of the integrated circuit chip 10.

According to this embodiment, since the first and second interconnecting patterns 62 and 50 can be electrically connected with the integrated circuit chip 10 interposed, a direct bonding portion between the first and second interconnecting patterns 62 and 50 can be reduced (for example, eliminated), and the reliability can be improved. Since the end portion of the first substrate 60, the end portion of the second substrate 70, and the integrated circuit chip 10 are disposed so as to overlap, the electronic device can be made more compact.

In the method of manufacturing the electronic device of this embodiment, the integrated circuit chip 10 may be mounted on the first substrate 60, and then mounted on the second substrate 70. In more detail, this is as described in the first embodiment. Alternatively, after fixing the first and second substrates 60 and 70, the integrated circuit chip 10 may be mounted on the first and second substrates 60 and 70.

Third Embodiment

Figure 12:
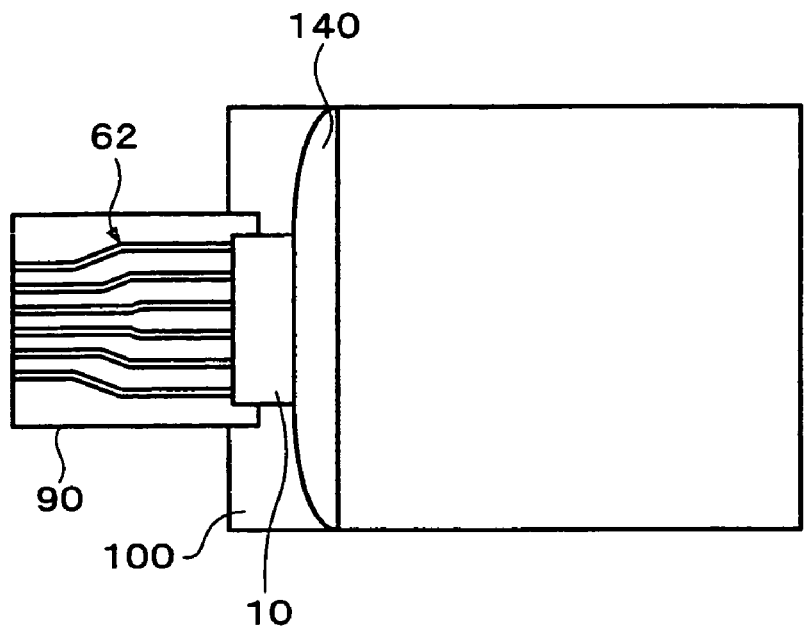
FIG. 12 shows an electronic device of the third embodiment of the present invention.
Figure 13:
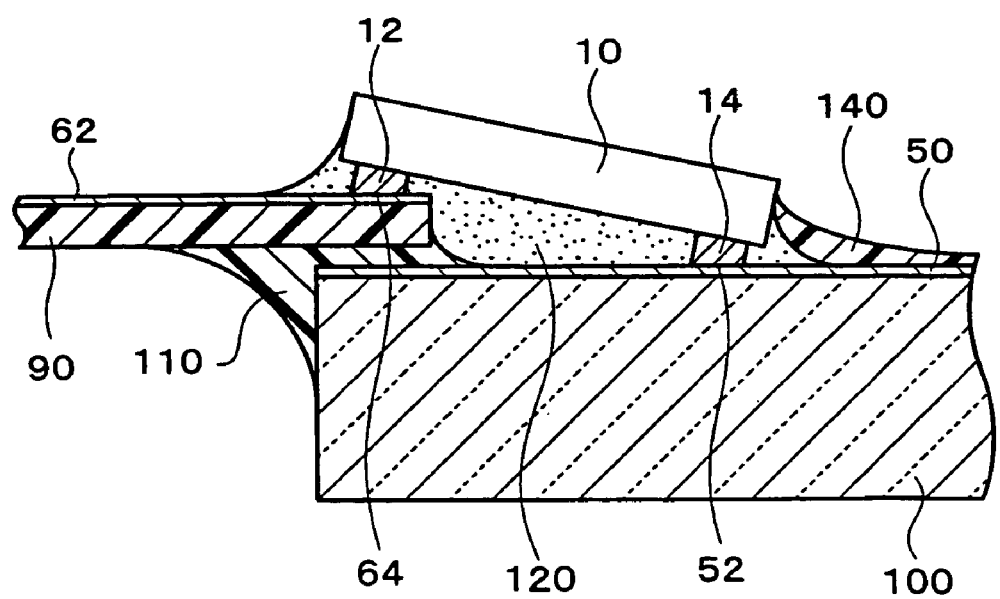
FIG. 13 is a partial sectional view of the electronic device of the third embodiment of the present invention.

FIG. 12 shows an electronic device of the third embodiment of the present invention. FIG. 13 is a partial sectional view of the electronic device of the third embodiment of the present invention. The electronic device may have the integrated circuit chip 10 described in the first embodiment.

The electronic device has a first substrate 90. For the details of the first substrate 90, the details of the first substrate 60 described in the second embodiment apply. Then the first substrate 90 has a first interconnecting pattern 62 having first electrical connection sections 64.

The electronic device has a second substrate 100. With regard to the material constituting the second substrate 100 and properties thereof, the details of the second substrate 30 described in the first embodiment apply. On the second substrate 100, the second interconnecting pattern 50 described in the first embodiment is formed.

In this embodiment, an end portion of the first substrate 90 is attached to an end portion of the second substrate 100.

Moreover, the end portion of the first substrate 90 and the end portion of the second substrate 100 overlap. Therefore, the first and second interconnecting patterns 62 and 50 (first and second electrical connection sections 64 and 52) have different heights. Therefore, the integrated circuit chip 10 is inclined. More specifically, the integrated circuit chip 10 is disposed inclined with respect to the portion of the first substrate 90 in which the first connection portions 64 are formed, and the portion of the second substrate 100 in which the second electrical connection sections 52 are formed. With regard to other details, the description in the second embodiment applies. With the electronic device of this embodiment, the same benefit as described in the second embodiment can be achieved.

Figure 14:
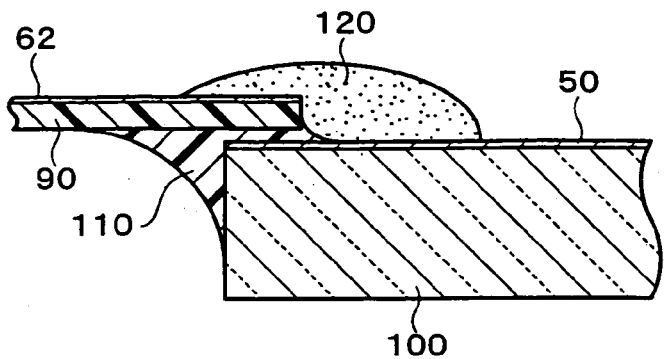
FIG. 14 illustrates the method of manufacturing the electronic device of the third embodiment of the present invention.
Figure 15:
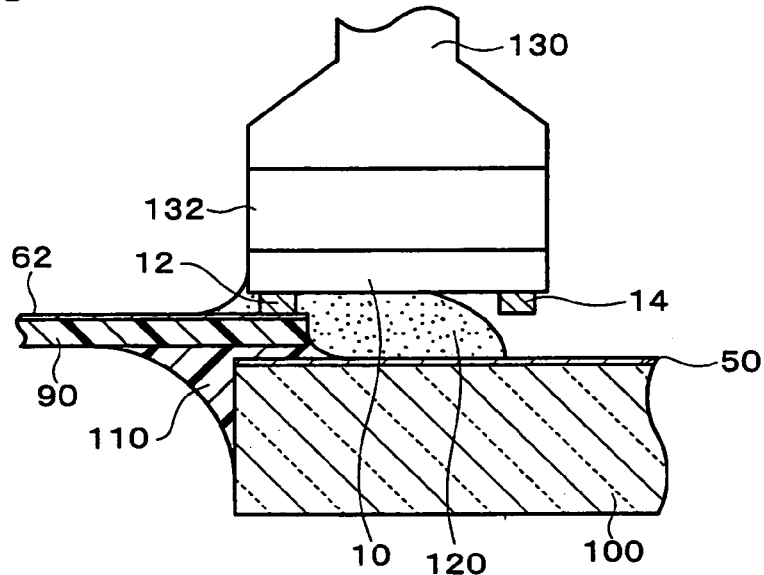
FIG. 15 illustrates the method of manufacturing the electronic device of the third embodiment of the present invention.
Figure 16:
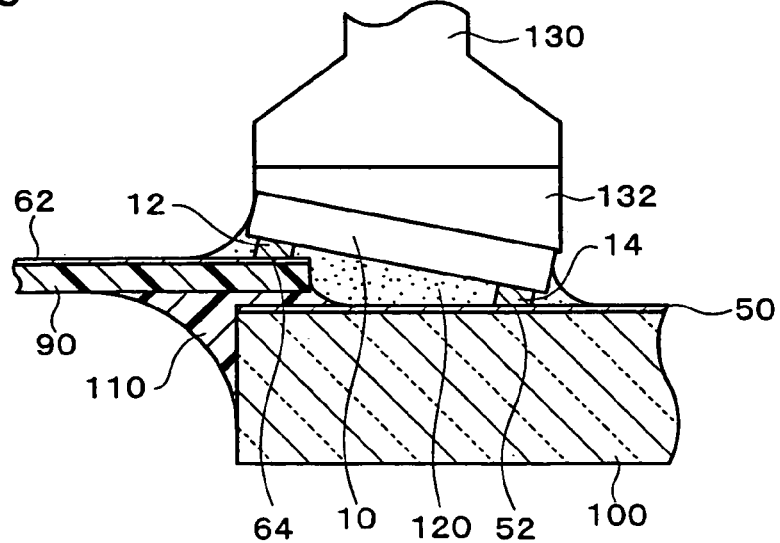
FIG. 16 illustrates the method of manufacturing the electronic device of the third embodiment of the present invention.

FIGS. 14 to 16 illustrate the method of manufacturing the electronic device of this embodiment. First, the first substrate 90 and second substrate 100 are adhered together. In this embodiment, the end portion of the first substrate 90 and the end portion of the second substrate 100 are overlapped, and the first substrate 90 and second substrate 100 are adhered. For this adhesion, as shown in FIG. 14, a resin (for example, an adhesive) 110 may be used. It should be noted that as the resin 110 may be used a resin having a stress absorbing function. By means of this, the first substrate 90 and the second substrate 100 can be can be strongly bonded, and an electronic device of high reliability with respect to mechanical stress can be manufactured.

Next, the integrated circuit chip 10 is bonded. As shown in FIG. 14, in the region for mounting the integrated circuit chip 10, an ACP (anisotropic conductive paste) 120 is provided. It should be noted that in place of ACP, ACF (anisotropic conductive film) may also be used. ACP and ACF are insulating adhesives including dispersed conducting particles. Then by means of a bonding tool 130, the integrated circuit chip 10 may be subjected to pressure, and the first electrodes 12 pressed into the first electrical connection sections 64, electrically connecting the first electrodes 12 and the first electrical connection sections 64 (see FIG. 15). Then the integrated circuit chip 10 may be further subjected to pressure, whereby the end portion 132 of the bonding tool 130 is deformed, and the second electrodes 14 and the second electrical connection sections 52 be electrically connected (see FIG. 16). Finally, the ACP (or ACF) may be cured, whereby the integrated circuit chip 10 is bonded. The description here uses ACP and ACF, but using an insulating adhesive not including conducting particles, the first electrodes 12 may be pressed into the first electrical connection sections 64, and the second electrodes 14 pressed into the second electrical connection sections 52, and electrically connected using an adhesive bond. The ACP, ACF, and insulating adhesive may include insulating particles. Rather than an adhesive bond, the first electrodes 12 and the first electrical connection sections 64 may be electrically connected by a metal bond. In this case, an adhesive bond may be used in parallel, and after metal bonding, the bond portions between the first electrodes 12 and the first electrical connection sections 64 and the bond portions between the second electrodes 14 and the second electrical connection sections 52 may be sealed with resin.

The integrated circuit chip 10 may be subjected to pressure from the bonding tool 130 while the top surface of the end portion 132 is inclined with respect to the surface of the first substrate 90 and second substrate 100. The top surface of the end portion 132 may be inclined by inclining the bonding tool 130 itself. Without inclining the bonding tool 130 itself, when the integrated circuit chip 10 is subjected to pressure, at least the end portion 132 of the bonding tool 130 may be deformed along the integrated circuit chip 10, whereby the top surface of the end portion 132 is inclined. The end portion 132 of the bonding tool 130 may be formed from a elastic body, and in this case, the end portion 132 is able to undergo elastic deformation. Therefore, without inclining the bonding tool 130 itself, the second electrodes 14 can be pressed against the second electrical connection sections 52, and the second electrodes 14 and the second electrical connection sections 52 can be electrically connected (see FIG. 16). It should be noted that the end portion 132 may be formed, for example, of Teflon (registered trademark). The integrated circuit chip 10 may be subjected to pressure from the bonding tool 130 with the top surface of the end portion 132 approximately parallel to the reverse surface of the integrated circuit chip 10 from the surface on which the first and second electrodes 12 and 14 are provided. The integrated circuit chip 10 may be subjected to pressure from the bonding tool 130 with the top surface of the end portion 132 approximately parallel to the surfaces of the first substrate 90 and second substrate 100.

Figure 17:
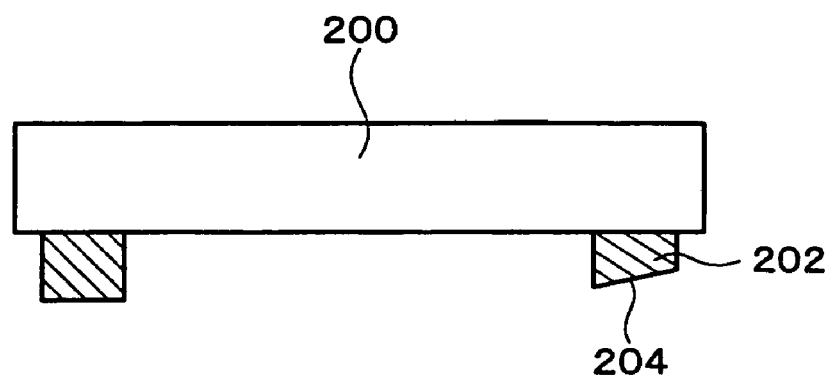
FIG. 17 illustrates the method of manufacturing the electronic device of the third embodiment of the present invention.
Figure 18:
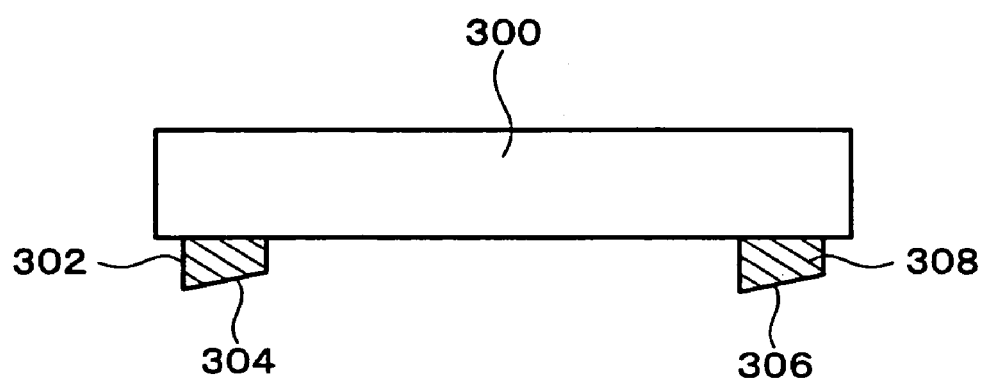
FIG. 18 illustrates the method of manufacturing the electronic device of the third embodiment of the present invention.
Figure 19:
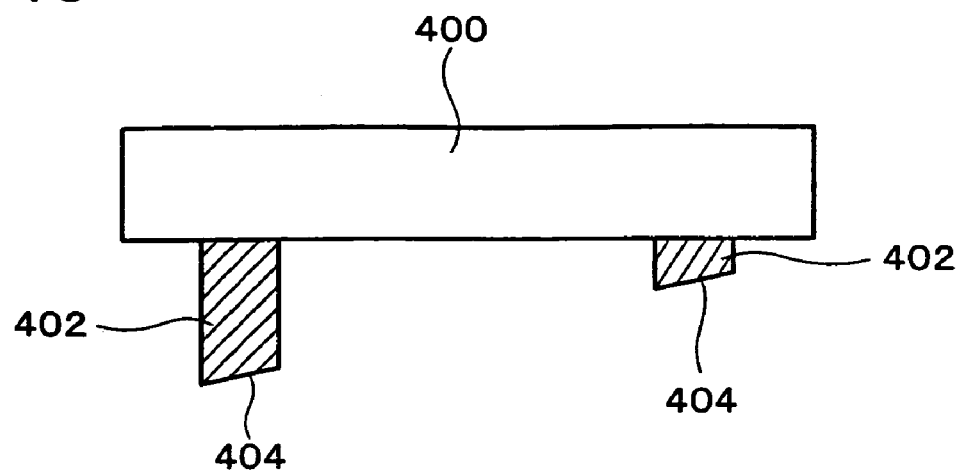
FIG. 19 is a partial sectional view of the electronic device of the fourth embodiment of the present invention.

In the bonding process of the integrated circuit chip 10, the first electrodes 12 may undergo plastic deformation according to the angle between the planes forming the surface of the first substrate 90 and the surface of the integrated circuit chip 10 on which the first electrodes 12 are provided. On this occasion, the first electrodes 12 may undergo plastic deformation according to the angle between the planes forming the surface of the second substrate 100 and the surface of the integrated circuit chip 10 on which the second electrodes 14 are provided. Before the bonding process of the integrated circuit chip 10, the second electrodes 14 may be subjected to deformation according to the angle between the planes forming the surface of the first substrate 90 or second substrate 100 and the surface of the integrated circuit chip 10 on which the first and second electrodes 12 and 14 are provided, as shown in FIGS. 17 to 19. By means of this, while maintaining the spacing between adjacent electrodes of the first and second electrodes 12 and 14, a large area can be provided for the bond portions between the first electrodes 12 and the first electrical connection sections 64 and the bond portions between the second electrodes 14 and the first and second electrical connection sections 64 and 52. Therefore, bad electrical connections are less likely to occur, and moreover, the electrical connections can be stabilized.

Finally, a protective film 140 protecting the second interconnecting pattern 50 may be formed, and the electronic device of this embodiment manufactured (see FIGS. 12 and 13). It should be noted that the material of the protective film 140 is not particularly restricted, but for example, may be formed of silicone.

As shown in FIG. 17, the electronic device of this embodiment may be manufactured using an integrated circuit chip 200 having the top surface 204 of second electrodes 202 previously inclined. By means of this, conducting particles more easily accumulate between the top surface 204 of the second electrodes and the second electrical connection sections 52, and an electronic device of high electrical connection reliability can be manufactured. Alternatively, as shown in FIG. 18, the electronic device of this embodiment may be manufactured using an integrated circuit chip 300 having respective top surfaces 304 and 308 of first and second electrodes 302 and 306 previously inclined. In this case, the integrated circuit chip may be mounted using a bonding tool with a previously inclined top surface. The electrodes having top surfaces previously inclined may be formed with the conducting members electrically connected to the integrated circuit subjected to leveling. It should be noted that the integrated circuit chips 200 and 300 described in this embodiment can also be used in the other embodiments.

In the method of manufacture described above, after attaching the end portion of the first substrate 90 to the end portion of the second substrate 100, a step of electrically connecting the first interconnecting pattern 62 and the first electrodes 12, and a step of electrically connecting the second interconnecting pattern 50 and the second electrodes 14 are carried out, to manufacture the electronic device of this embodiment. However, the method of manufacturing an electronic device of this embodiment is not limited to this, and for example, the first interconnecting pattern 62 and first electrodes 12 may be electrically connected (connecting the first substrate 90 and the integrated circuit chip 10), and thereafter the step of attaching the end portion of the first substrate 90 to the end portion of the second substrate 100, and the step of electrically connecting the second interconnecting pattern 50 and the second electrodes 14 carried out, to manufacture the electronic device of this embodiment. The integrated circuit chip 10 electrical connections are not restricted to using ACP (or ACF), and as described in the first embodiment, any known method of connection may be applied.

Fourth Embodiment

Integrated Circuit Chip

FIG. 19 is a partial sectional view of an integrated circuit chip 400 of the fourth embodiment of the present invention. The integrated circuit chip 400 may be a semiconductor chip. The plan form of the integrated circuit chip 400 is generally rectangular (square or oblong), but is not particularly restricted.

The integrated circuit chip 400 of this embodiment has a plurality of electrodes 402, in the form of bumps and with top surfaces 404 inclined. More specifically, the top surfaces 404 of the electrodes 402 are formed so as not to be parallel to the surface of the integrated circuit chip 400 on which the electrodes 402 are provided. The top surfaces 404 of the plurality of electrodes 402 may each be formed to lie in substantially the same plane. The integrated circuit chip 400 of this embodiment may be formed with end portions of cylindrical (or spherical) conducting members electrically connected to the integrated circuit caused to be inclined by a leveling process. It should be noted that the electrodes 402 may be disposed two parallel sides or four sides of the integrated circuit chip, or may be disposed in an area array.

Since the top surfaces 404 of the electrodes 402 of the integrated circuit chip 400 of this embodiment are inclined, the contact area of the electrodes 402 with the interconnecting lines and the like is increased. Therefore, while preserving the spacing between adjacent electrodes, a larger area for the bond portions of the electrodes 402 with the interconnecting lines and the like can be obtained. Therefore, an integrated circuit chip can be provided in which bad electrical connections are less likely to occur, and the electrical connections are stable. It should be noted that the integrated circuit chip 400 of this embodiment can also be used in other embodiments.

Electronic Device

Figure 20:
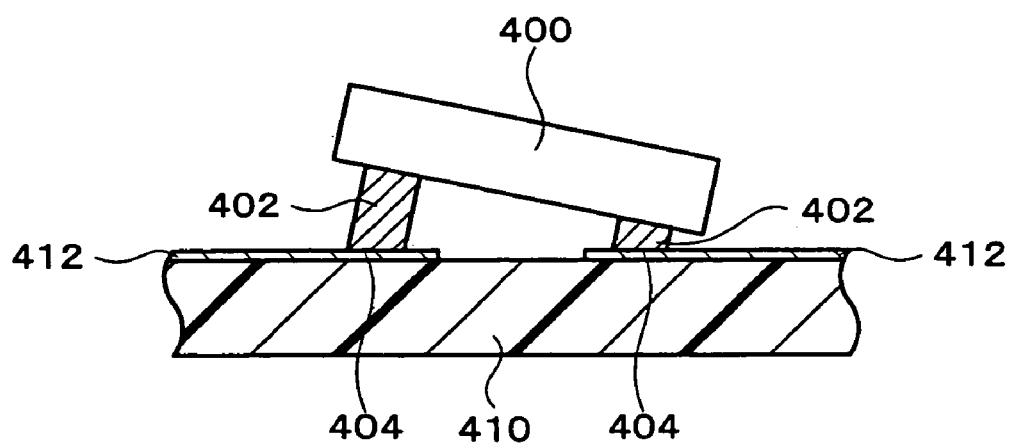
FIG. 20 is a partial sectional view of an integrated circuit chip of the fifth embodiment of the present invention.

FIG. 20 is a partial sectional view of the electronic device of the fourth embodiment of the present invention. In this embodiment, the electronic device has a substrate 410 on which an interconnecting pattern 412 is formed. As the substrate 410 may be used any conventionally known substrate. The electronic device has an integrated circuit chip 400 mounted on the substrate 410. The integrated circuit chip 400 is disposed so that the surface on which the electrodes 402 are formed is not parallel to the surface of the substrate 410 on which the interconnecting pattern 412 is formed.

The integrated circuit chip 400 has a plurality of electrodes 402 electrically connected to the interconnecting pattern 412. In other words, the electrodes 402 of the integrated circuit chip 400 are electrically connected to the interconnecting pattern 412. The interconnecting pattern 412 and the electrodes 402 may be electrically connected by any known method of connection. Between the integrated circuit chip 400 and the substrate 410 may be provided an underfill material, not shown in the drawings.

The electronic device of this embodiment may be manufactured by mounting the integrated circuit chip 400, having the top surfaces 404 of the electrodes 402 previously inclined, on the substrate 410. Alternatively, the electronic device of this embodiment may be manufactured by inclining the top surfaces of the electrodes when mounting the integrated circuit chip on the substrate.

In the electronic device of this embodiment, the integrated circuit chip 400 is disposed so that the surface on which the electrodes 402 are provided is not parallel to the surface of the substrate 410 on which the interconnecting pattern 412 is formed. Therefore, the projected area of the integrated circuit chip 400 can be reduced, and mounting of the integrated circuit chip and so forth at a high density is made possible.

Figure 21:
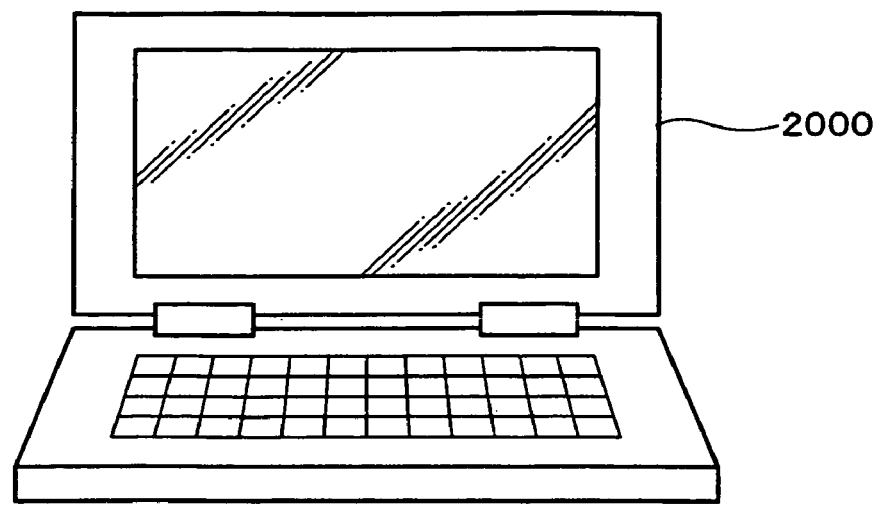
FIG. 21 shows an electronic instrument of an embodiment of the present invention.
Figure 22:
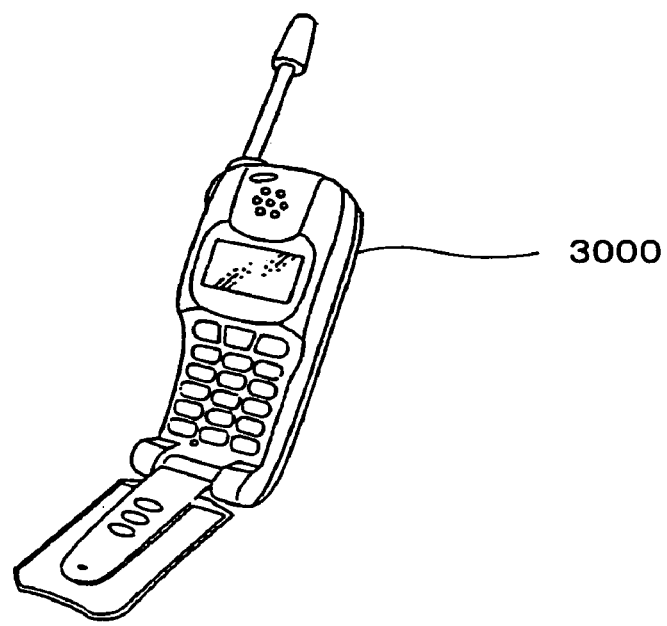
FIG. 22 shows an electronic instrument of an embodiment of the present invention.

As an electronic instrument having the above described electronic device, FIG. 21 shows a notebook personal computer 1000, and FIG. 22 shows a portable telephone 2000.

It should be noted that the present invention is not restricted to the above described embodiments, and various modifications are possible. For example, the present invention includes substantially the same construction as the construction described in the embodiment (for example, a construction for which the function, method, and result are the same, or a construction of which the purpose and result are the same). The present invention includes a construction in which parts which are not of the essence of the construction described in the embodiment are replaced. The present invention includes a construction having the same effect as the construction described in the embodiment or a construction capable of achieving the same purpose. The present invention includes a construction having the construction described in the embodiment to which is added well-known art.

What is claimed is:

1. A method of manufacturing an electronic device comprising:

(a) positioning first electrical connection sections of a first interconnecting pattern and first electrodes of an integrated circuit chip so as to overlap each other, and electrically connecting the first electrical connection sections and the first interconnecting pattern, the first interconnecting pattern being formed on a first substrate;

(b) positioning second electrical connection sections of a second interconnecting pattern and second electrodes of an integrated circuit chip so as to overlap each other, and electrically connecting the second electrical connection sections and the second interconnecting pattern, the second interconnecting pattern being formed on a second substrate; and (c) attaching an attachment portion of the first substrate to the second substrate, wherein the integrated circuit chip is inclined with respect to a first surface of the first substrate on which the first electrical connection sections are formed and a second surface of the second substrate on which the second electrical connection sections are formed.

2. The method of manufacturing an electronic device as defined by claim 1, wherein a top surface of each electrode in at least the second electrodes is inclined.

3. The method of manufacturing an electronic device as defined by claim 1, wherein the step (b) is carried out after carrying out the step (a).

4. The method of manufacturing an electronic device as defined by claim 1, wherein the steps (a) and (b) are carried out simultaneously, after carrying out the step (c).

5. The method of manufacturing an electronic device as defined by claim 1, wherein the step (a) is carried out after carrying out the step (c), then the step (b) is carried out.

6. The method of manufacturing an electronic device as defined by claim 1, wherein the steps (b) and (c) are carried out simultaneously, after carrying out the step (a).

* * * * *